United States Patent [19]

Cochran et al.

[11] 4,161,697
[45] Jul. 17, 1979

[54] AUTOMATICALLY CLARIFYING RADIO RECEIVER

[75] Inventors: Michael J. Cochran, Richardson; Edward R. Caudel, Dallas, both of Tex.

[73] Assignee: Texas Instruments Incorporated, Dallas, Tex.

[21] Appl. No.: 791,449

[22] Filed: Apr. 27, 1977

[51] Int. Cl.² .............................................. H04B 1/16
[52] U.S. Cl. ....................................... 325/330; 325/418
[58] Field of Search ........................ 325/15, 20, 21, 25, 325/137, 330, 338, 416, 417, 418, 419, 420; 328/167; 333/70 T; 329/105

[56] References Cited

U.S. PATENT DOCUMENTS

| 3,588,701 | 6/1971 | Kahn | 325/15 |
| 3,641,434 | 2/1972 | Yates | 325/25 |
| 3,835,973 | 9/1974 | Liff | 325/25 |
| 3,969,675 | 7/1976 | Gosling | 325/137 |
| 3,983,484 | 9/1976 | Hodama | 325/25 |

FOREIGN PATENT DOCUMENTS 2040869  3/1972  Fed. Rep. of Germany ........... 325/330

*Primary Examiner*—Robert L. Griffin
*Assistant Examiner*—Michael A. Masinick
*Attorney, Agent, or Firm*—Stephen S. Sadacca; James T. Comfort; Melvin Sharp

[57] ABSTRACT

A radio receiver receives input signals comprised of a plurality of frequency bands lying respectively within a plurality of non-overlapping frequency channels. The signals include an itermittently present reference frequency signal. The radio receiver includes an autolock circuit for measuring the frequency of the intermittently present carrier and for generating digital signals indicating its frequency. A digital processor has inputs coupled to receive the digital signals for calculating in response thereto a selectable demodulating frequency dependent upon the frequency of the intermittently present carrier.

8 Claims, 21 Drawing Figures

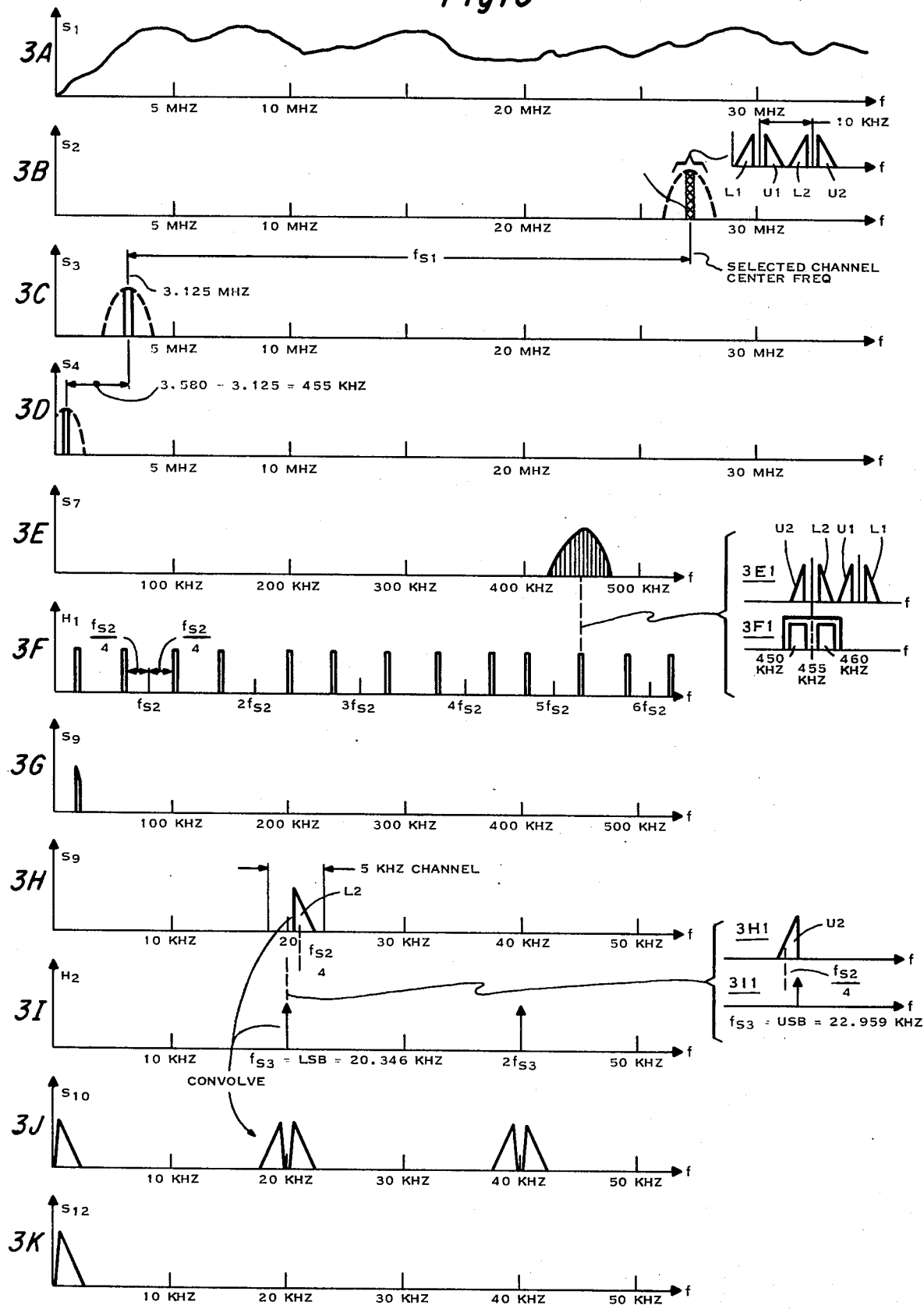

CCD—FILTER 700

AM/SSB DETECTOR 900

CLOCKING MODULE 3000

CLOCKING MODULE 3100

Fig. 8 (÷N6)

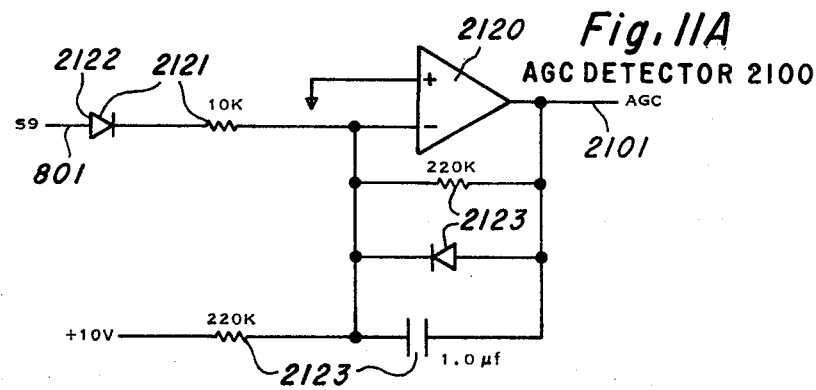
Fig. 11A AGC DETECTOR 2100
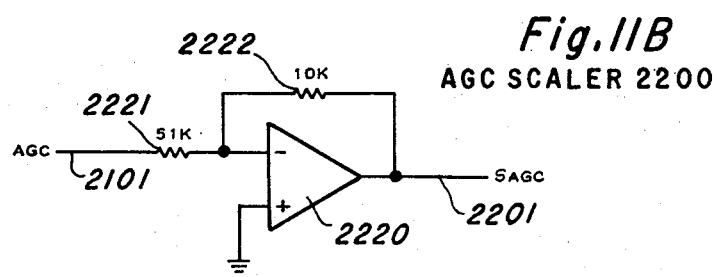
Fig. 11B AGC SCALER 2200
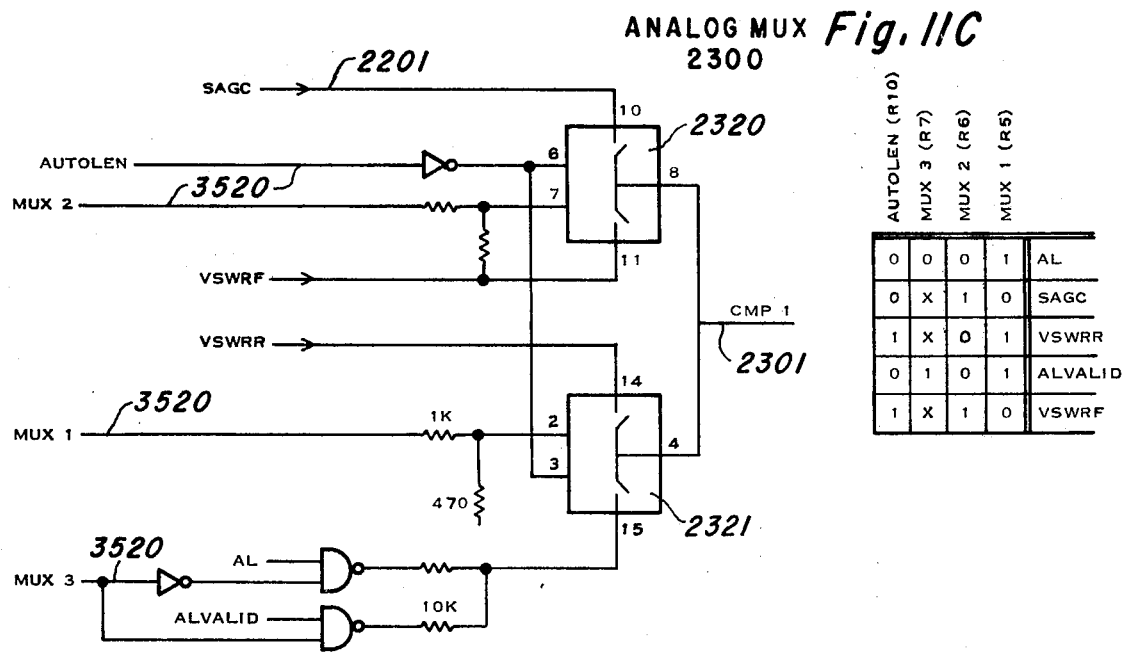
Fig. 11C ANALOG MUX 2300

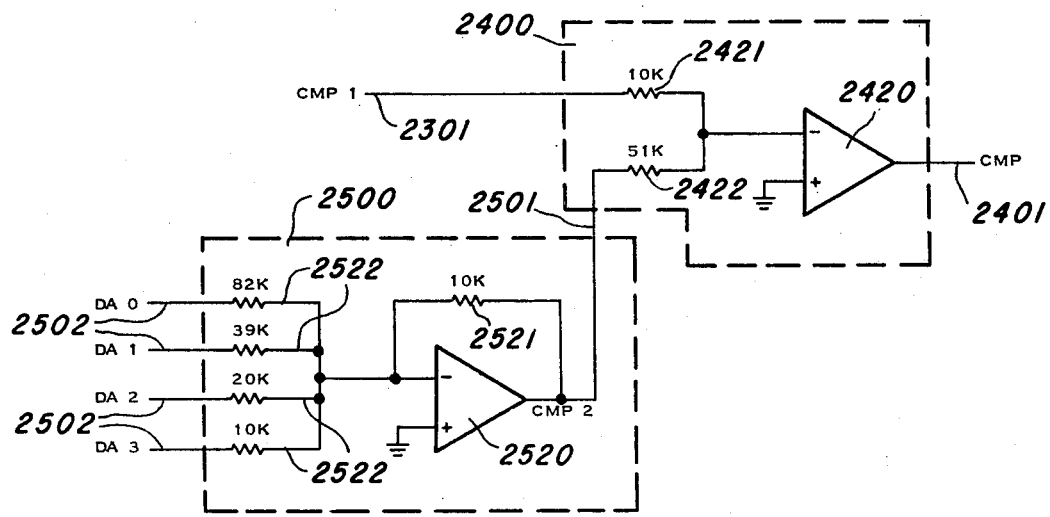
Fig. 11D D-A CONV 2500 AND COMPARATOR 2500
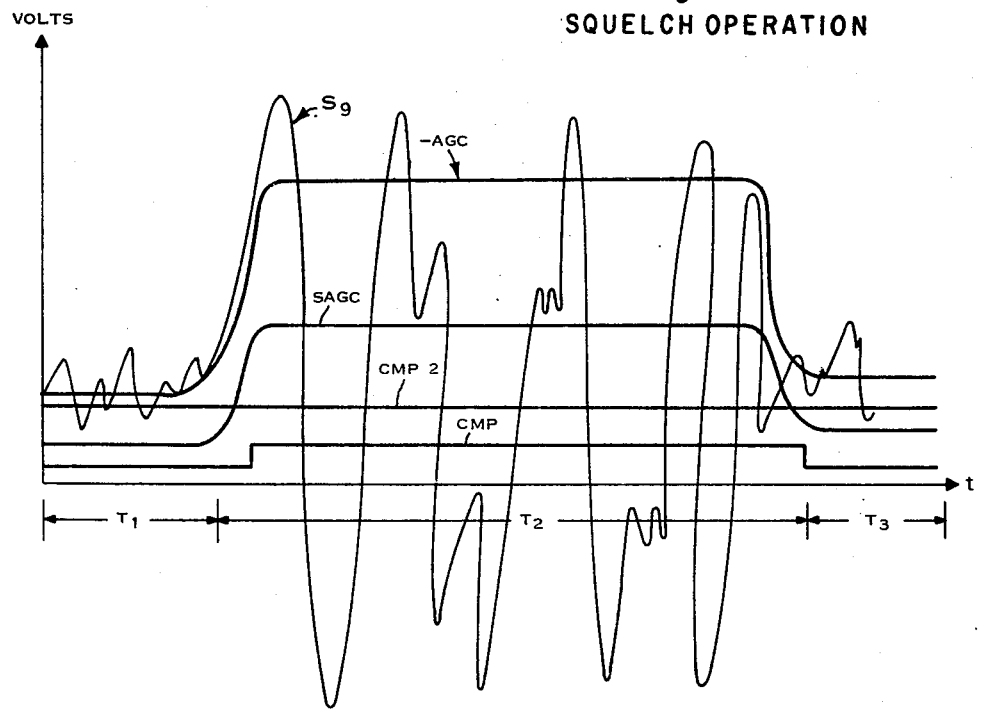
Fig. 11E SQUELCH OPERATION

AUTO LOCK LOGIC

AUTO LOCK TIMING

AUTOMATICALLY CLARIFYING RADIO RECEIVER

BACKGROUND OF THE INVENTION

This invention relates to analog signal processing, and more particularly to radio systems.

This invention further relates to the transceiver and components thereof described and claimed in the following U.S. Patent Applications filed of even date with an assigned to the assignee of the present invention: U.S. Ser. No. 791,611 entitled "A Digitally Transmitting Transceiver" by Edward R. Caudel and William R. Wilson; U.S. Ser. No. 791,629 entitled "A Clarifying Radio Receiver" by Michael J. Cochran and Edward R. Caudel; U.S. Ser. No. 791,264 entitled "An Electronic Phase Locked Loop" by Michael J. Cochran; U.S. Ser. No. 791,450 entitled "A Transceiver With Only One Reference Frequency" by Michael J. Cochran; U.S. Ser. No. 791,265 entitled "A Signal Strength Measuring Tranceiver" by Edward R. Caudel; U.S. Ser. No. 791,614 entitled "A Charge Transfer Device Radio System" by Michael J. Cochran; U.S. Ser. No. 791,253 entitled "A Transceiver Capable of Sensing a Clear Channel" by Jerry D. Merryman, Michael J. Cochran and Edward R. Caudel; U.S. Ser. No. 791,256 entitled "A Highly Selective Programmable Filter Module" by Michael J. Cochran and Edward R. Caudel; and U.S. Ser. No. 791,616 entitled "A Dual Processor Transceiver" by Edward R. Caudel, William R. Wilson and Thomas E. Merrow. Such copending patent applications are hereby incorporated herein by reference. Radio systems receive radiated electronic input signals comprised of a plurality of non-overlapping frequency bends, filter a selectable band from the plurality, frequency shift the filtered band from radio frequencies to a lower frequency, and convert the selected band to audible sounds. The input signals may be amplitude modulated (AM), or signal sideband (SSB) signals as an example. Antenna means receive the radiated input signals. Filtering devices are included in the radio system to select one of the bands from the plurality. Mixing devices are included to frequency shift the selected band. And demodulator devices are included to demodulate the selected band.

In the past, single sideband signals have been particularly troublesome to receive with clarity. The problem arises because sideband signals have no carrier to lock onto to aide in demodulation. And demodulation is made more difficult because transmitters which send signals sideband signals are not required to align the signals with a fixed reference frequency, but only are required to place the sideband signals somewhere within a frequency channel. Thus, the receiving system is required to demodulate the sideband signals regardless of where they lie within their respective channel. This requirement is known in the art as the clarifying function of a receiver.

Prior art receivers perform the clarifying function by hand tuning. For example, the receiver operator manually adjusted the frequency of a mixing clock signal by turning a control knob. In response thereto, the frequency of a mixing clock signal was either increased or decreased until the speaker output produced clearly sounding audible tones. By comparison, the present invention performs the clarification without manual intervention. This is achieved by a transceiver having means for transmitting sideband signals which include an intermittently present carrier. The transceiver further includes frequency measuring means which are operable in the receive mode to detect the frequency of an intermittently transmitted carrier. After comparing the nominal frequency of the transmitted carrier to the actual carrier frequency measured, the disclosed invention automatically compensates for any frequency difference by appropriately adjusting a clocking frequency for the receive circuitry.

Accordingly, it is one object of the invention to provide an improved single sideband radio system.

It is another object of the invention to provide a sideband transmitter capable of transmitting sideband signals including therein an intermittent carrier frequency.

It is another object of the invention to provide a sideband transmitter which transmits a carrier frequency for a short interval just prior to transmitting sideband signals.

It is another object of the invention to provide a sideband receiver capable of detecting a carrier frequency which is present for intermittent time intervals in a sideband signal.

It is another object of the invention to provide a sideband receiver capable of automatically clarifying sideband signals.

It is still another object of the invention to provide a sideband receiver having a microprocessor for automatically generating micro-commands indicating a selectable frequency that clarifies a received sideband signal.

SUMMARY OF THE INVENTION

These and other objectives are accomplished in accordance with the invention by a transceiver having a reference frequency signal generator. In the transmit mode, the transceiver transmits the reference frequency for a short time interval (several milliseconds) prior to transmitting audible sounds. In one embodiment, the intermittent carrier is transmitted in response to a "Push to Talk" key being depressed. Subsequent to the transmission of the intermittent carrier, single sideband signals are broadcast in their usual format.

In the receive mode, the transceiver includes frequency measuring means having inputs coupled to receive a selected sideband channel. The frequency measuring means measures the frequency of an intermittent carrier present in the channel and generates digital signals indicating its actual frequency. Microprocessor means are included which have inputs coupled to receive the digital signals. The processor calculates a frequency for a clocking signal which will compensate for any difference between the actual carrier frequency and a nominal carrier frequency. Clocking means are provided for receiving digital micro-commands from the microprocessor indicating the calculated frequency. The clocking means generates a clocking signal of the calculated frequency in response to the micro-commands.

In one embodiment, the calculated clocking frequency is applied to the clock input of a charge transfer device filter. The charge transfer device filter frequency shifts its input signals dependent upon the frequency of the clocking signal. In a second embodiment, the calculated frequency is applied to a sampling demodulator to vary its sampling rate. In still another embodiment, the calculated frequency is applied to a mixer for varying the mixing frequency.

DESCRIPTION OF THE DRAWINGS

The essential features believed to be characteristic of the invention are set forth in the appended claims; the invention itself, however, as well as other features and advantages thereof, may best be understood by referring to the following detailed description of the preferred embodiments when read in reference to the accompanying drawings; wherein:

FIG. 3 is a set of frequency diagrams illustrating signals in the frequency domain which are present at various points on the receive signal path of FIG. 2.

FIGS. 11A–11E are detailed circuit diagrams of the squelch portion of the transceiver of FIG. 2.

DETAILED DESCRIPTION OF SPECIFIC EMBODIMENTS

Figure 1:
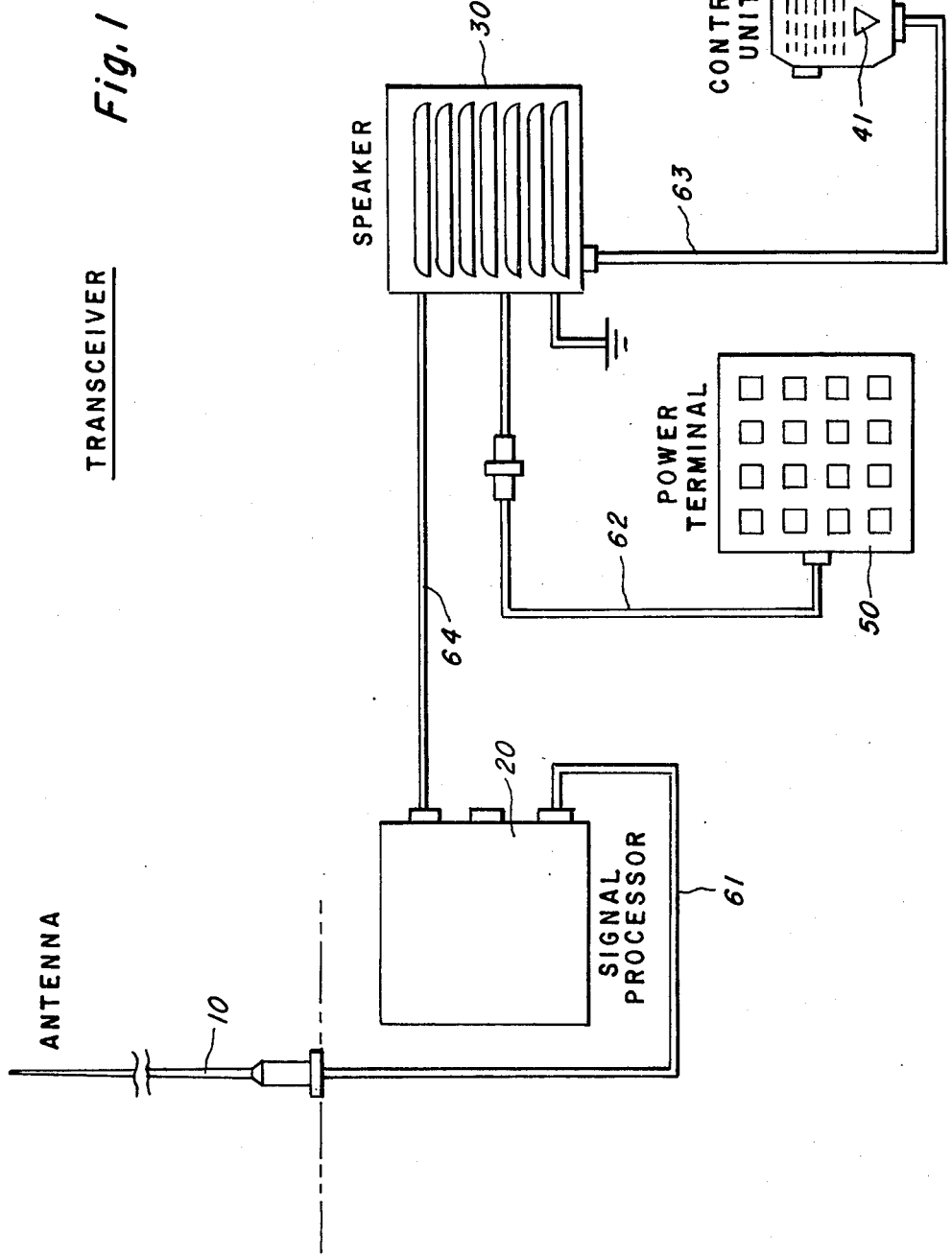
FIG. 1 is a block diagram illustrating the major components of a transceiver constructed according to the invention.

Referring now to FIG. 1, a block diagram illustrating the major components of a transceiver which is constructed according to the invention is illustrated. The transceiver is comprised of an antenna 10, a signal processing unit 20, a speaker 30, a control unti 40, and a power terminal 50. These components are electrically intercoupled by conductive cables 61–64 as illustrated in FIG. 1. The length of cables 61–64 are chosen to suit the particular environment in which the transceiver operates. For example, if the operating environment is an automobile, the length of cables 61–64 are chosen to permit operator access to speaker 30 and control unit 40, battery power connection to power terminal 50, operable mounting of antenna 10, and theft secure packaging of signal processor 20.

The transceiver of FIG. 1 has a transmit mode of operation and a receive mode of operation. Basically, in the transmit mode the operator speaks into a microphone 41 contained in control unit 40, and the audio signals are therein converted to electrical signals which are sent to analog signal processor 20 over cables 63 and 64. Signal processor 20 frequency shifts the received signal from an audio frequency to a frequency band of a selectable high frequency channel. The selected channel may be either a single sideband channel of approximately 5-kHz bandwidth, or an amplitude modulated channel of approximately 10 kHz. In either case the frequency shifted signals are sent via cable 61 to antenna 10 and therein transmitted via radiation.

In the receive mode, antenna 10 receives radiated electrical signals comprised of a plurality of frequency bands lying respectively within a plurality of non-overlapping frequency channels. The plurality of frequency bands are sent to signal processor 20 via cable 61. Signal processor 20 filters a selectable band from the plurality of bands, and down shifts in frequency the selected band to an audible frequency range. The selected down shifted frequency band is sent to speaker 30 via cable 64 where it is therein converted to audible sounds.

Figure 2:
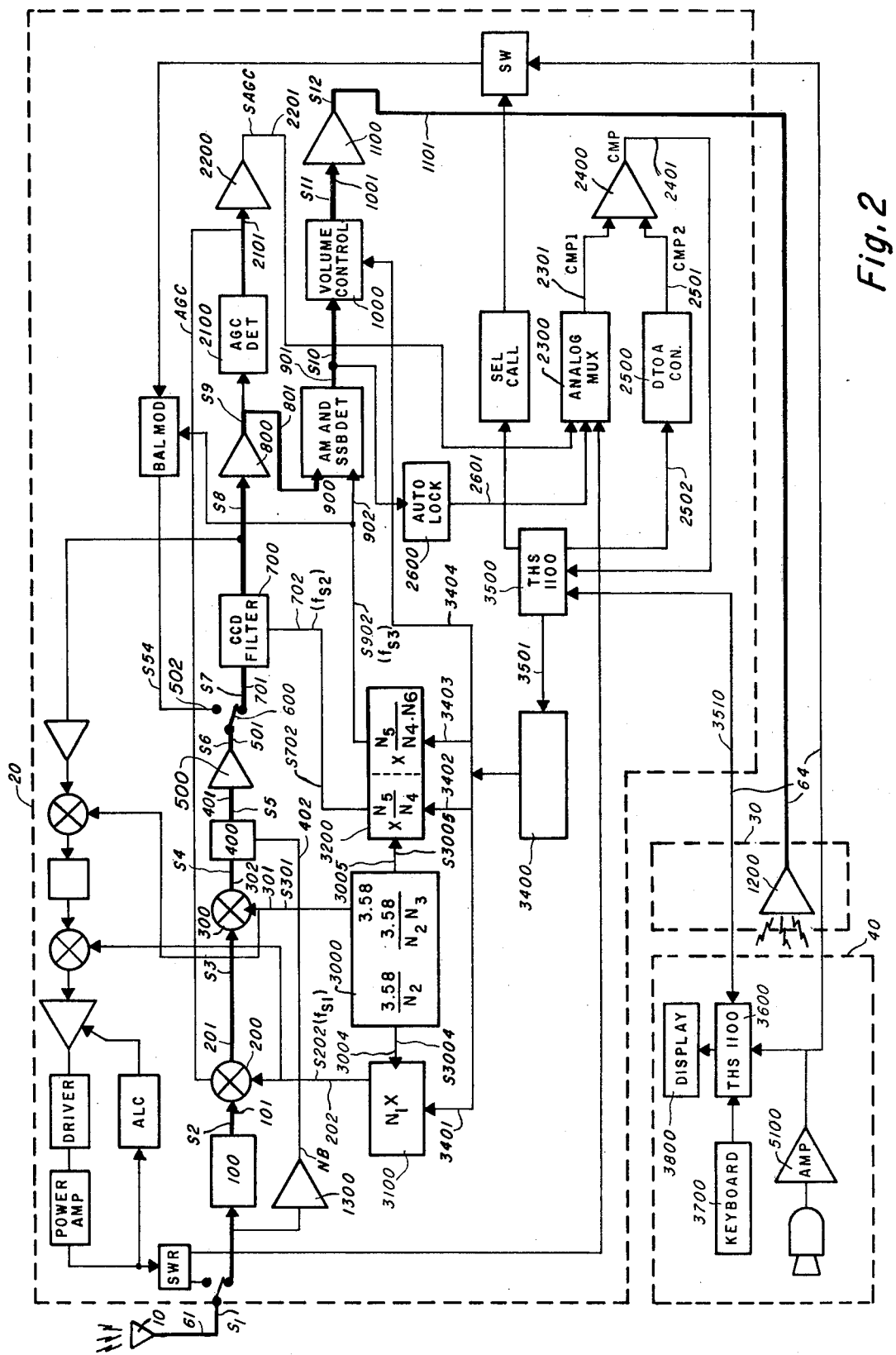
FIG. 2 is a more detailed block diagram of the transceiver of FIG. 1 wherein the receive signal path components are emphasized.

The manner in which the transceiver of FIG. 1 performs the above described receive operation is best understood by referring to FIG. 2 and FIG. 3. FIG. 2 is a circuit diagram of the transceiver of FIG. 1. The circuit includes a signal path which is operable in the receive mode and which is emphasized in FIG. 2 by a thickened line. Signals S1–S12 are present at various points (as illustrated in FIG. 2) on this signal path. FIG. 3 is a set of frequency diagrams illustrating some of the signals S1–S12 in the frequency domain.

Antenna 10 is the first element of the receive signal path. Cable 61 couples to the output of antenna 10 and signal S1 as illustrated in diagram 3a is generated thereon. Basically, signal S1 is unfiltered and thus is comprised of frequency components which cover the electromagnetic spectrum. Lead 61 couples to filter 100. Filter 100 has an output lead 101 and signals S2 generated thereon. As illustrated in FIG. 3b, signal S2 has a frequency range of approximately 26 mHz to 28 mHz. The skirt response of filter 100 is not critical as its only function is to pass the band of frequencies lying between 26.965 mHz and 27.405 mHz. This range of frequencies includes 40 amplitude modulated (AM) channels as presently assigned by the FCC. Each AM channel is divided into a lower sideband channel and an upper sideband channel. Diagram 3b illustrates the 26.965 Mhz–405 mHz frequency range by the cross hatched areas S2a. Diagram 3B1 is a blow up of area S2a and single sideband channels L1, U1, L2, U2, lying within the first two AM channels are illustrated therein.

Lead 101 couples to the signal input of a mixer 200 which has an output lead 201 and signals S3 are generated thereon. Mixer 200 also has an input lead 202 for receiving clock signals of the first selectable frequency $f_{s1}$. The frequency $f_{s1}$ is chosen to equal the difference between the center frequency of the selected Am channel and the quantity 3.125 mHz. Mixer 200 generates signals S3 by mixing signal S2 with frequency $f_{s1}$, and thus the selected AM channel is centered at the frequency 3.125 mHz. This fact is illustrated in Diagram 3c.

Lead 201 couples to a second mixer 300. Mixer 300 has a clock input lead 301 and an output lead 302. A clocking signal of 3.58 mHz is applied to lead 301. Mixer 300 mixes signals S3 with the signal on lead 301 and, in response thereto, generates signals S4 on lead 302. As a result of the mixing operation, the selected AM channel in S4 is centered at frequency 455 kHz. Diagram 3d illustrates signal S4.

Signal S4 passes through a noise blanker 400, and noise blanker 400 is serially coupled to an amplifier 500. Signals S5 and S6 are generated by noise blanker 400 an amplifier 500, respectively. In general, the function of noise blanker 400 and amplifier 500 is to filter and amplify signal S4, but not to frequency shift signal S4. Thus, the center frequency of the selected channel is present in signal S6 at 455 kHz. Signal S6 is illustrated in the frequency domain in Diagram 3e.

In the receive mode, a switch 600 couples signals S6 to the input of a charge transfer device filter 700 via a lead 701. Charge transfer device filter 700 also has a clocking lead 702 for receiving clocking signals of a second selectable frequency $f_{s2}$. In response to the frequency $f_{s2}$, filter 700 generates output signals S8 on a lead 703.

In the preferred embodiment, charge transfer device filter 700 is a charge coupled device (CCD) transversal filter having a plurality of passbands which are programmable by varying the selectable frequency $f_{s2}$. Copending application, Ser. No. 758,366, entitled, "Frequency Converting Filter," by Jerry Norris and Clinton Hartmann, filed January, 1977, assigned to the same assignee of this application, contains a detailed description of its construction. Basically, the charge coupled device transversal filter is comprised of a plurality of serially connected stages having a split electrode structure defining an impulse response of the form (sine N/N) (cosine $2\pi$ $f_0$N). In this expression, the frequency $f_0$ equals $1/(N_0 \times t_s)$ where the quantity $1/t_s$ equals the selectable frequency $f_{s2}$, and $N_0$ is the number of stages over which the term cosine ($2\pi$ $f_0$t) completes one cycle. The bandwidth $\Delta f$ of each of the passbands equals $1/(t_s N_1)$ where the quantity $1/t_s$ again equals the selectable sampling frequency $f_{s2}$, and $N_1$ equals the number of stages in which the term (sine N)/N passes before reaching its first zero crossing. Copending application, Ser. No. 758,365, entitled, "Programmable Frequency Converting Filter," by Lawrence Reagan, filed Jan. 5, 1977, assigned to the same assignee of this application, describes how the passbands of a charge transfer device transversal filter are programmed in response to a clocking frequency.

In one preferred embodiment, the parameters $N_0$ and $N_1$ are chosen such that the passbands of filter 700 have a center frequency of $N \times f_{s2} \pm \frac{1}{4}f_{s2}$, and the bandwidth of filter 700 equals $1/20 f_{s2}$. Diagram 3f illustrates the frequency response of the charge coupled device filter having the above described characteristics. The function of the filter 700 is to receive signals S7 on lead 701, to filter a selected one of the channels (either AM or sideband) from the plurality of channels comprising signal S7, and to frequency shift the selected channel down in frequency.

If the selected channel is a single sideband channel, the channel has a width of approximately 5 kHz and thus filter 700 is clocked with a frequency $f_{s2}$ such that its passbands are approximately 5 kHz wide. In other words, the quantity 1/20 $f_{s2}$ approximately equals 5 kHz when the selected channel is a single sideband channel. Additionally, the frequency $f_{s2}$ is chosen such that one of the multiple passbands of filter 700 aligns with the sideband channel to be selected from S7. In the preferred embodiment, the passband of filter 700 that is centered at $5f_{s2} + \frac{1}{4}f_{s2}$ is aligned with the sideband channel selected from signal S7. This is filter 700's eleventh passband. A, frequency $f_{s2}$ equal to 86,409 Hz aligns the center of the eleventh passband of filter 700 with frequency 450 kHz. And a clocking frequency $f_{s2}$ of 86,932 Hz aligns the center of the eleventh passband of filter 700 at 460 kHz. The width of both of these passbands is approximately 5 kHz. Diagram 3E1 is a blow up of signal S7 about the frequency of 455 kHz, and Diagram 3F1 is a blow up of Diagram 3F about the same frequency. Together, these figures illustrate the alignment of the eleventh passband of filters 700 with the selected channel. It should also be noted, as illustrated in Diagram 3E1, that the mixing operation of mixer 300 results in the flip-flopping in frequency of the upper and lower sideband channels. This flip-flopping occurs because the mixing frequency of 3.58 mHz is higher than the center frequency of the selected AM channel, i.e., 3.125 mHz.

The clocking frequency $f_{s2}$ is also chosen such that filter 700 had bandwidths of approximately 10 kHz, one of which is centered about the frequency of 455 mHz. Such a characteristic is used to pass an AM signal centered about 455 kHz. A clocking frequency $f_{s2}$ equal to 202,218 Hz causes filter 700 to have its passband centered at 455 kHz and a bandwidth of approximately 10 kHz. This situation is also illustrated in Diagrams 3E1 and 3F1.

Lead 703 couples the output of CCD filter 700 to an amplifier 800. Amplifier 800 is tuned to pass only those frequencies lying within the first passband of CCD filter 700. That is, amplifier 800 only passes frequencies lying about $\frac{1}{4}$ $f_{s2}$. Amplifier 800 has an output lead 801 and signals S9 are generated thereon. 3G illustrates signal S9 on the same frequency scale as 3F (which illustrates the passbands of filter 700); and 3H illustrates signal S9 on an expanded frequency scale so that its characteristics are more apparent. In 3H, the signal S9 is illustrated as lower sideband channel L2 as an example.

Signal S9 is coupled to a demodulator 900 via the lead 801. Demodulator 900 functions to shift signals S9 in frequency to the audio range. When sideband signals are received, this shift in frequency is accomplished by time sampling signal S9 at a third selectable $f_{s3}$. Time sampling equals convolution in the frequency domain. Diagram 3I illustrates the frequency components of a sampling transfer function H2 which samples at a frequency $f_{s3}$ and Diagram 3J illustrates the convolution of signal S9 with transfer function H2. This convolution signal is labeled S10 and is generated on a lead 901.

In order to properly shift signal S9 to the audio frequency range by the convolution operation, it is necessary that the frequency $f_{s3}$ be carefully aligned frequencies of S9. When signal S9 is a lower sideband, frequency $f_{s3}$ is chosen to align with the lowest frequency present. Thus, in FIGURE 3H, frequency $f_{s3}$ lies to the left of the quantity $f_{s2}/4$, and nominally is 20.346 kHz.

One difficulty in receiving single sideband signals is that they have no carrier to lock onto. Thus, the exact position in frequency of the signal S9 is unknown. All that is known is that the signal lies somewhere within its assigned 5 kHz channel; and therefore a problem exists in being able to align frequency $f_{s3}$ with signal S9 regardless of where the latter lies within its channel. The tone quality of the resulting audible signal is directly related to how well frequency $f_{s3}$ and signal S9 are aligned. Elements 3200–3500 (to be described later) provide a means for incrementally adjusting frequency $f_{s3}$ so as to be properly aligned with signal S9 regardless of where it lies within its 5-kHz channel.

As described above, amplitude modulated signals may also be received. In that case, frequency $f_{s2}$ equals 202,218; and therefore signal S9 which is centered at $f_{s2}/4$ has a center frequency of 50.555 kHz. Demodulator 900 shifts this signal to the audio range by a standard diode envelope detector which does not require a third sampling frequency.

Signal S10 couples via lead 901 to volume control unit 1000. Volume control unit 1000 has an output lead 1001 and signals S11 are generated thereon. Lead 1001 couples to an audio amplifier 1100 which has an output lead 1101 and signals S12 are generated thereon. Lead 1101 coupled to a speaker 30 where the signals S12 are converted to audible sounds. Diagram 3K illustrates signals S12 in the frequency domain and as therein illustrated they are proportional to the lowest band of frequencies comprising the convolution signal S10—the magnitude of signal S12 being controlled by the operation of volume control unit 1000 and amplifier 1100.

Figure 4A:
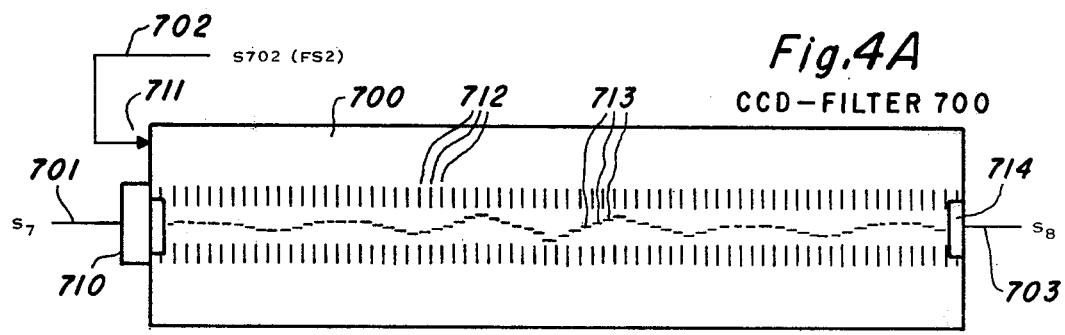
FIGS. 4A–4B are detailed circuit diagrams of two of the components comprising the signal path of FIG. 2.

FIG. 4A is a greatly enlarged top view of CCD transversal filter 700. Lead 701 couples to an input stage 710 of filter 700. Lead 702, carrying clocking signals of the second selectable frequency $f_{s2}$, couples to the clocking input 711 of filter 700. As previously described, filter 700 is comprised of a plurality of serially-connected stages 712; and each of the stages has a split electrode. These splits 713 have a profile of the form (sine N/N) (cosine $2\pi f_0 N$). This structure has a plurality of passbands centered about multiples of the frequency $f_{s2}$ as previously described. Lead 703 couples to an output stage 714 of filter 700, and the signals S8 are generated thereon.

Figure 4B:
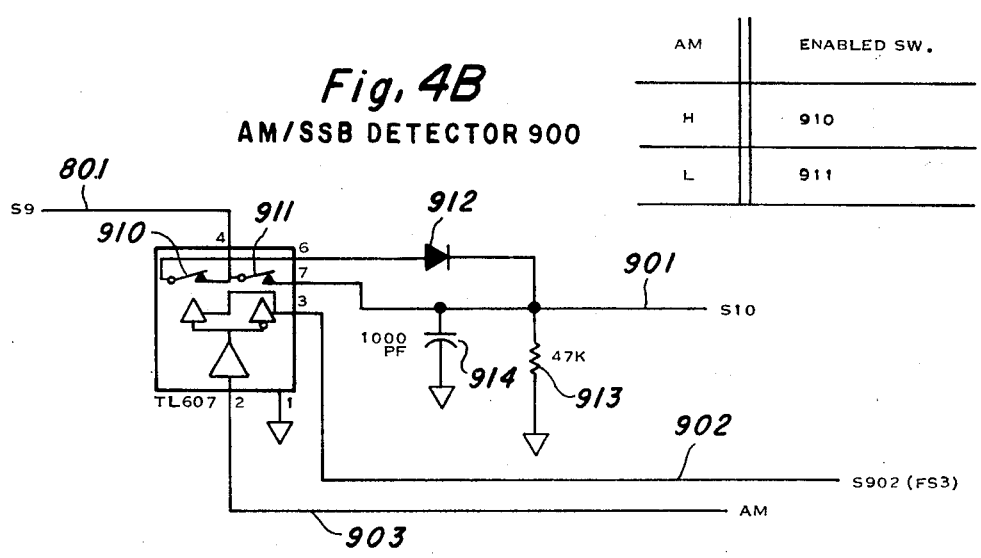

Detector 900 is illustrated in FIG. 4B. Basically, detector 900 is comprised two logically-controlled switches 910 and 911 having a common input coupled to lead 801. Logic control inputs, coupled to leads 902 and 903 are provided for logically controlling the operation of switches 910 and 911. Texas Instruments part number TL607 is an example of such a switch. A logic signal AM is applied to lead 903, and signal S902 comprised of the third selectable frequency $f_{s3}$ is applied to lead 902. Switch 910 is permitted to be closed when signal AM is at a high voltage level, while switch 911 is permitted to be closed when signal AM is at a low voltage level. The actual closure of switch 910 and 911 is determined by signal S902. When amplitude-modulated signals are received, signal AM and signal S902 are both at a high voltage level, and thus, signal S9 passes through switch 910. The output of switch 910 is coupled to a diode 912 and a low-pass filter comprised of circuit elements 913 and 914. Lead 901 couples to the output of the low-pass filter. Conversely, when single sideband signals are received, signal AM is at a low voltage level and signal S902 contains the third selectable frequency $f_{s3}$. Thus, switch 911 opens and closes in response to frequency $f_{s3}$. This sampling operation shifts signal S9 down in frequency as was illustrated in Diagrams 3H–3J. The output of switch S9 couples to the low-pass filter and to lead 901.

As the preceding description indicates, the operation of the transceiver of FIG. 2 is dependent upon the proper generation of three selectable frequencies $f_{s1}$, $f_{s2}$, and $f_{s3}$. The clocking means for generating these frequencies will now be described. FIG. 2 illustrates these clocking means in block diagram form. They are comprised of clocking modules 3000, 3100, and 3200. Basically, module 3000 generates signal S301 which is comprised of a fixed frequency of 3.58 mHz. Module 3000 also generates signals S3004 and S3005 on leads 3004 and 3005, respectively. Lead 3004 couples to module 3100, which in response to S3004 generates signals S202 comprised of frequency $f_{s1}$. Lead 3005 couples to module 3200 which receives signals S3005 and, in response thereto, generates signals S702 and S902 comprised of frequencies $f_{s2}$ and $f_{s3}$, respectively.

The selectable frequencies $f_{s1}$, $f_{s2}$, $f_{s3}$ are generated by modules 3000 and 3200 as multiples of 3.58 mHz. These multiples are designated as $N_1$–$N_6$ in FIG. 2. Some of the multiples are fixed, while other multiples are programmable. TABLE IV lists the selectable frequencies $f_{s1}$, $f_{s2}$, $f_{s3}$ along with the multiples $N_1$–$N_6$ and the intermediate clocking signals S3004 and S3005 as a function of the particular single sideband channel or AM channel that is to be received.

TABLE I

|  | SSB-CH | | | | AM-CH | |
| --- | --- | --- | --- | --- | --- | --- |
|  | 1L | 1U | 2L | 2U | 1 | 2 |
| OSC | 3.58MHz→ | → | → | → | → | → |
| $f_{s1}$ | 23.84MHz | 23.84MHz | 23.85MHz | 23.85MHz | 23.84MHz | 23.85MHz |
| $N_2$ | 1432→ | → | → | → | → | → |
| S3004 | 2.5KHz→ | → | → | → | → | → |
| $N_1$ | 9,536→ | → | 9,540→ | → | 9,536 | 9,540 |
| $f_{s2}$ | 86.932Hz | 86,409Hz | 86,932Hz | 86,409Hz | 202,218Hz |  |
| $N_3$ | 10→ | → | → | → | → | → |
| S3005 | 250Hz→ | → | → | → | → | → |
| $N_4$ | 55→ | → | → | → | 24→ | → |
| $N_5$ | 19,125 | 19,010 | 19,125 | 19,010 | 19,413 | 19,413 |
| $f_{s3}$ | 20,345Hz | 22,959Hz | 20,345Hz | 22,959Hz | H | H |
| $N_6$ | 235 | 207 | 235 | 207 | x | x |

Given the values of $f_{s1}$, $f_{s2}$ and $f_{s3}$ as listed in TABLE I, $N_1$–$N_6$ must be chosen such that the desired frequencies are obtained. To this end, multiplier $N_2$ is chosen to be 1432. Thus, signal S3004 is a fixed frequency of 2.4 kHz. Accordingly, a selectable frequency $f_{s1}$ of 23.84 kHz is obtained by setting $N_1$ to 9,536 or 9,540, respectively.

As TABLE I further illustrates, the multiplier $N_3$ is fixed at a value of 10. Thus, signal S3005 is a fixed frequency of 250 Hz. And therefore, selectable frequency $f_{s2}$ becomes 86,932 (as required to receive lower sideband signals) when multiplier $N_5$ equals 19,125. Similarly, frequency $f_{s2}$ equals 86,409 or 202,218 when multiplier $N_5$ equals 19,010 or 19,413, respectively.

Selectable frequency $f_{s3}$ is generated by appropriately choosing $N_6$. As illustrated in TABLE I, frequency $f_{s3}$ is suitable for demodulating lower sideband channels when $N_6$ equals 235, and is suitable for demodulating upper sideband channels when multiplier $N_6$ equals 207.

As the preceding description pointed out, sideband signals may lie anywhere within their assigned 5-kHz channel, and thus it is desirable to control the selectable frequency $f_{s2}$ in fine increments. TABLE I implies how this fine incremental control is obtained. Signal S3005 has a fixed frequency of 250 hertz and multiplier $N_4$ is fixed at 55. This produces a frequency of 250 Hz/55 or approximately 5 Hz. Thus, by constructing multiplier $N_5$ as a programmable multiplier, frequency $f_{s2}$ is controllable in increments of approximately 5 Hz.

Figure 5:
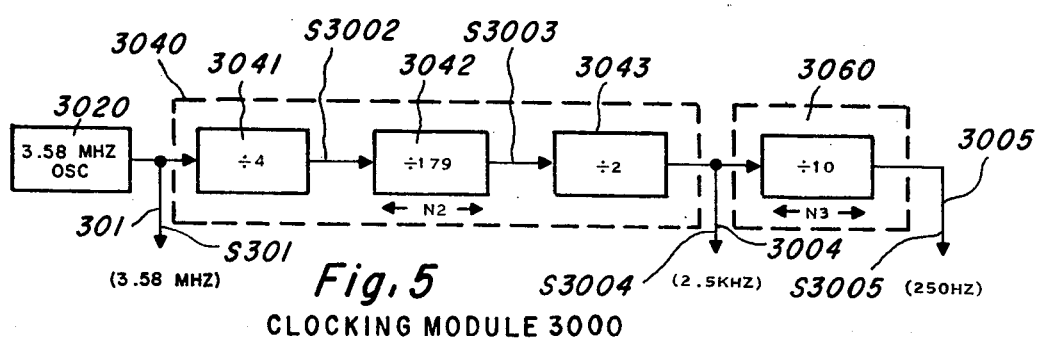
FIG. 5 is a are detailed circuit diagram of a clocking module 3000 included within FIG. 2.

FIGS. 5-8 illustrate the details of clocking modules 3000-3200. Referring first to FIG. 5, the details of clocking module 3000 are therein illustrated. Clocking module 3000 is comprised of a 3.58 mHz oscillator 3,020, a divide by $N_2$ logic circuit 3040 and divide by 10 logic circuit 3060.

Figure 6:
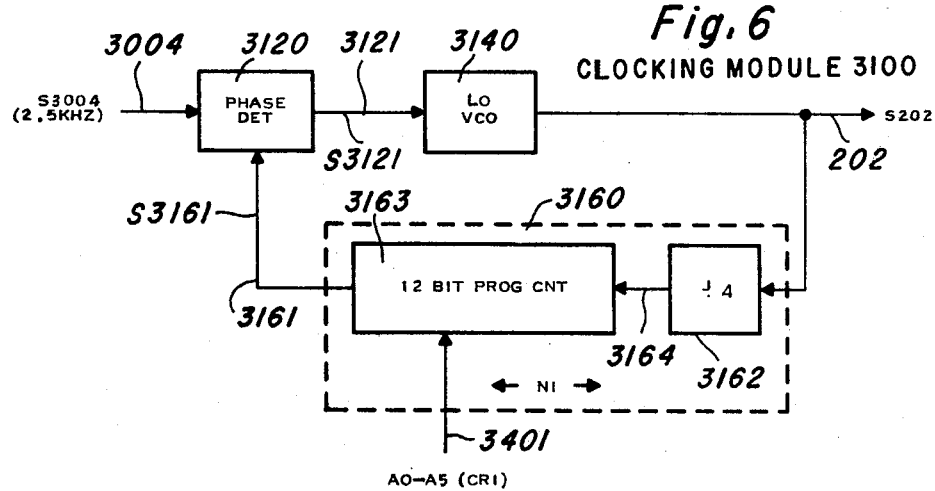
FIG. 6 is a detailed circuit diagram of a clocking module 3100 included within FIG. 2.

FIG. 6 illustrates the circuit details of clocking module 3100. As illustrated in FIG. 6, clocking module 3100 is implemented by means of a phase lock loop. The phase lock loop is comprised of a phase detector 3120, a voltage controlled oscillator (VCO) 3140, and a programmable counter 3160. Phase detector 3120 has a first input coupled to lead 3004 and a second input coupled to an output of programmable counter 3160 via a lead 3161. A lead 3121 couples an output of phase detector 3120 to an input of VCO 3140. Lead 202 couples an output of VCO 3140 to an input of counter 3160 thereby completing the phase locked loop.

Figure 7:
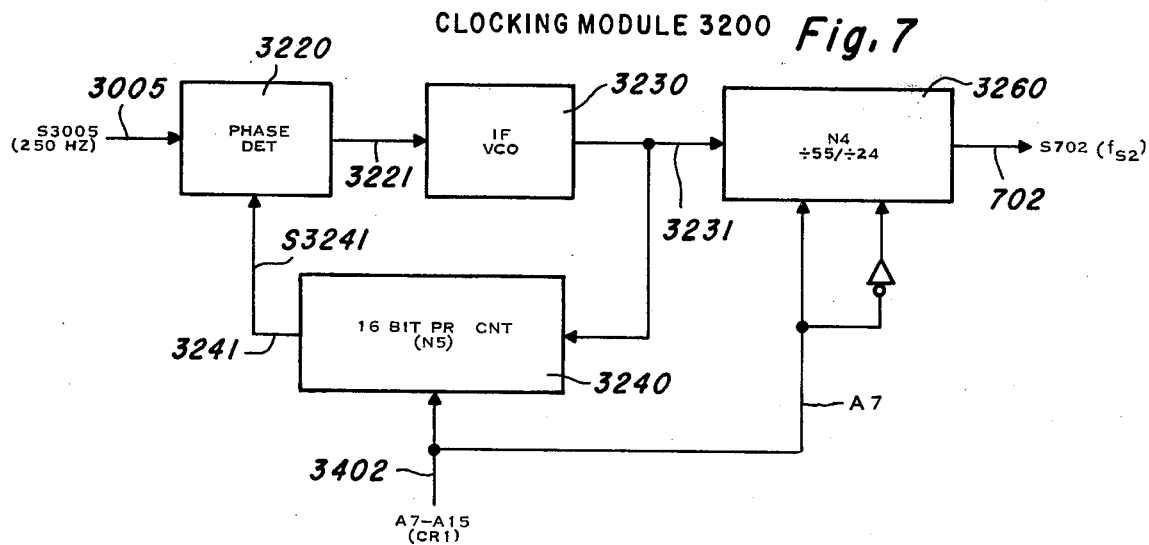
FIG. 7 is a are detailed logic diagrams of a clocking module 3200 included within FIG. 2.

A block diagram of clocking module 3200 is illustrated in FIG. 7. As therein illustrated, the N5 factor is implemented by means of a phase lock loop. This loop is similar in structure to the phase lock loop which was utilized to implement the N1 factor as described in FIG. 6. The phase lock loop in FIG. 7 is comprised of a phase detector 3220, a VCO 3230, and a 16-bit programmable counter 3240. Phase detector 3220 has a first signal input coupled to lead 3005 for receiving signals having reference frequency of 250 Hz, and a second input coupled to lead 3241 for receiving signals generated by counter 3240. The output of phase detector 3220 is coupled via a lead 3221 to an input of VCO 3230. A lead 3231 couples an output of VCO 3230 to an input of counter 3240, thereby completing the loop.

Figure 8:
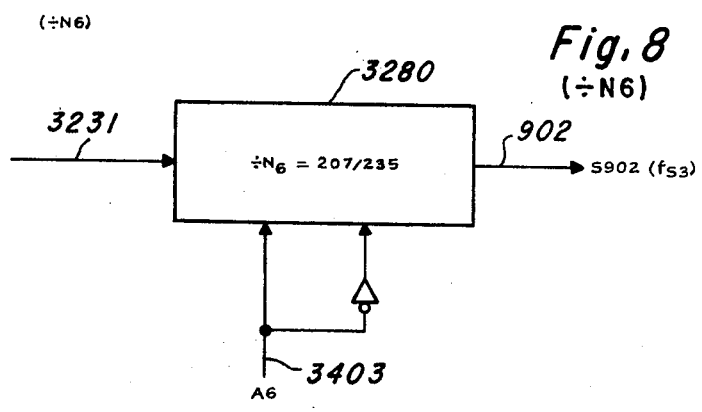
FIG. 8 is a detailed logic diagrams of a divide by N6 counter which forms a portion of clocking module 3200.

FIG. 8 illustrates the details of the divide-by-N6 counter which is utilized to generate the third selectable frequency $f_{s3}$. As therein illustrated, the divide N6 counter 3280 is similar in construction to the previously-described counters. That is, it is comprised of two, four-bit up counters 3285 and 3286 which are identical to the previously-described counters 3044 and 3045. The data inputs of these counters are selectively set to be the ones complement of 235 when the logic signal A6 is high, and the ones complement of 207 when the logic signal A6 is low. A logic gate 3288 couples to lead 902, and the logic signal S902 comprised of the third selectable frequency $f_{s3}$ is generated thereon.

Figure 9:
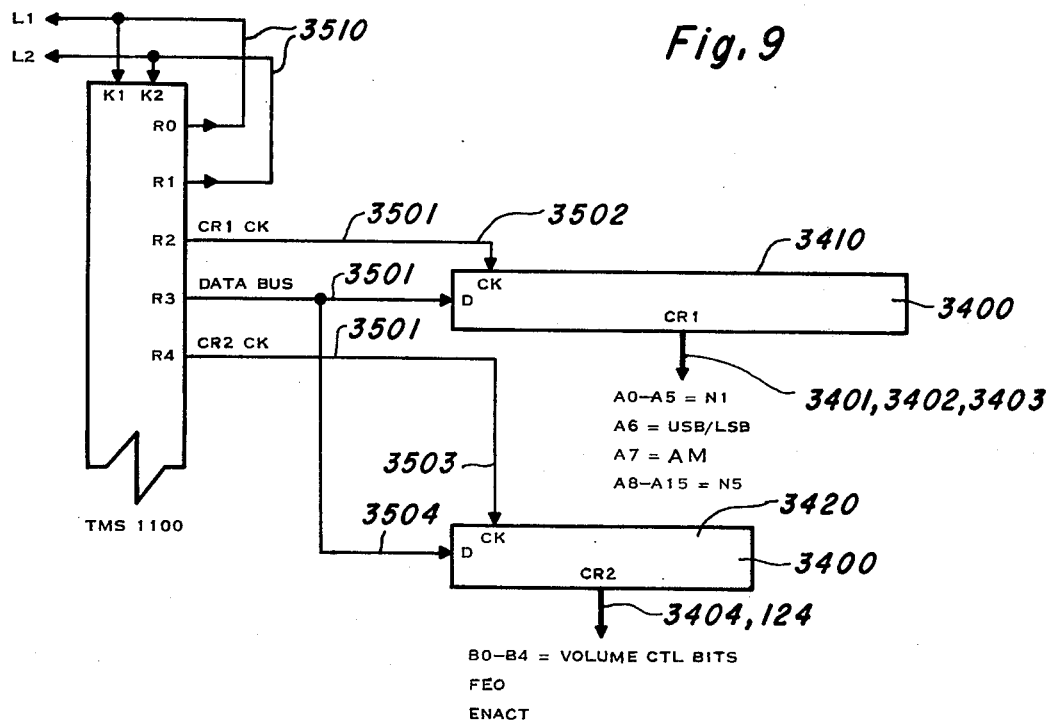
FIG. 9 is a circuit diagram illustrating the source of logic signals which are utilized by clocking modules 3000–3200 of FIGS. 5–8.

Referring now to FIG. 9, the source of the logic signals which are generated to specify the value of multipliers N1, N4, N5, and N6, and to operate volume control unit 1000 is therein illustrated. The source of these logic signals includes two logic registers 3400. One of the registers 3410 is a 16-bit register, and it has outputs coupled to leads 3401, 3402, and 3403. Output bits 0-6 of register 3410 are coupled to lead 3401 and signals A0-A6 are generated thereon. Output bits 7-15 of register 3410 are coupled to leads 3402 and signals A7-A15 are generated thereon. Output 3410 is coupled to lead 3403 to generate signal A6.

The second register 3420 is a seven-bit register. It has output bits 0-4 coupled to leads 3404 to thereby provide the volume control logic signals B0-B4. Bit 5 of register 3240 is coupled to lead 124 to provide previously described logic signal FEO. Bit 6 of register 3240 provides a logic signal ENACT (enable auto cell transmit) the function of which is described later in conjunction with transmit.

Registers 3410 and 3420 are comprised of D-type flip flops. A microprocessor 3500 is utilized to provide data and clocking input signals for both of these registers over leads 3501. This data constitutes microcommands which are interpreted and responded to by circuits coupled to the register outputs. In one embodiment, microprocessor 3500 is comprised of a TMS1100 which is manufactured by Texas Instruments Incorporated. Details of the TMS1100 are given in the publication entitled, "Programmers Reference Manual for the TMS 1000 Series MOS/LSI One-Chip Microcomputers." The publication is published and made available through Texas Instruments Incorporated. See also U.S. Pat. No. 3,991,305, by inventors Caudel et al assigned to Texas Instruments Incorporated.

The TMS1100 includes an 11-bit output register having bits labeled R0-R10. As illustrated in FIG. 9, bit R2 is coupled to the clocking input of register 3410 via a lead 3502, and a clocking signal CR1CK is generated thereon. Similarly, bit R4 is coupled to the clocking input of register 3420 via alead 3503, and a clocking signal CR2CK is generated thereon. Bit R3 is coupled to the data inputs of registers 3410 and 3420 via lead 3504, and a data signal called DATABUS is generated thereon.

The TMS1100 also includes a 4 bit input register having inputs K1, K2, K4, and K8. Inputs K1 and K2 are coupled to control unit 40 via leads 3510 to provide a means by which microprocessor 3500 receives control signals L1 and L2 from the control unit. In response to signals L1 and L2, microprocessor 3500 generates the logic signals CR1CK, CR2CK, and DATABUS to thereby specify the appropriate multipliers N1-N6 and the appropriate volume control bits. Signals L1 and L2 are described infra.

Several modifications to the above-described receive circuitry of the transceiver of FIG. 2 may be made without departing from the inventive concepts disclosed therein. For example, a microprocessor other than the TMS1100 may be utilized to receive control signals via leads 3510 and in response thereto to generate data and clocking signals for registers 3400. A TMS1000 or a TMS1200 may be utilized to replace the TMS1100 as an example. In addition, the counters comprising clocking modules 3000-3200 may be implemented with circuits other than those illustrated in FIGS. 5-8. For example, the programmable counters may be implemented with down-counters rather than up-counters, in which case the actual number to be counted, rather than its complement, would be applied to the data inputs of the counter. Further, CCD filter 700 may be constructed to have passbands centered about the frequencies $nf_{s2} \pm kf_{s2}$ where k is not equal to $\frac{1}{4}$. For example, k could equal $\frac{1}{8}$, in which case the values of N1-N6 would be scaled appropriately.

Figure 10:
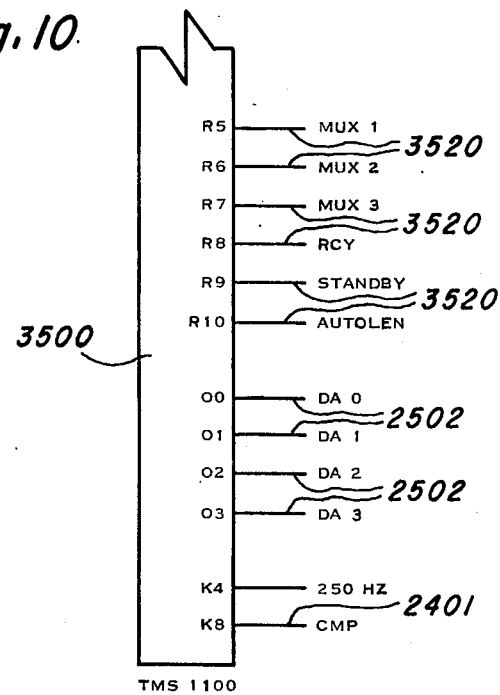
FIG. 10 is a block diagram of a micro computer which forms a portion of the circuit of FIG. 9.

Referring now to FIG. 10 a block diagram of that portion of the TMS1100 which was not included in FIG. 9 is therein illustrated. Input register bit k4 is coupled to receive a logic signal 250 Hz, and input register bit k8 is coupled to receive a logic signal CMP.

Further, output bits R5-R10 are the source of logic signals MUX1, MUX2, MUX3, RCV, STANDBY and AUTOLEN, respectively. These signals are microcommands to the circuits which receive them. Signal RCV is utilized to control switch 600 as was illustrated in FIG. 4f. In addition, the TMS100 has a second output register having output bits 00, 01, 02, and 03 which generate logic signals (microcommands), DA0, DA1, DA2, and DA3, respectively. The function of each of the above microcommands is described below.

The transceiver of FIG. 2 includes means for performing a squelch operation. The squelch operation functions during a receive mode to inhibit signals S9 from passing through volume control unit 1000 whenever signal S9 contains no information. The presence or absence of information in signal S9 is indicated by the amplitude of the signal. When the amplitude of signal S9 is relatively small, volume control unit 1000 is disabled by setting signal B4 on lead 3404 to a high voltage. Conversely, volume control unit 1000 is enabled by setting signal B4 to a low voltage when signal S9 has a relatively high amplitude.

Referring back to FIG. 2, the circuit components which are utilized to implement the squelch function are therein illustrated. These components include an AGC detector 2100 having an input coupled to lead 801 for receiving signal S9. In response to signal S9, AGC detector 2100 generates an analog signal AGC on a lead 2101. Signal AGC has an amplitude proportional to the time average amplitude of signal S9. Lead 2101 couples to the input of a scaling circuit 2200. An output of scaling circuit 2200 is coupled via a lead 2201 to an analog multiplexer 2300. Multiplexer 2300 has an output coupled to a lead 2301, and analog signals CMP1 are generated thereon. Lead 2301 couples to the input of an analog comparator 2400. Comparator 2400 has an output coupled via a lead 2401 to the K8 input of TMS1100 microprocessor 3500. Comparator 2400 has a second input which is coupled to the output of a digital-to-analog converter 2500 via a lead 2501. Converter 2500 generates analog signals CMP2 on lead 2501. The TMS 1100 microprocessor generated signals DA0-DA4 are coupled via leads 2502 to inputs to converter 2500.

FIGS. 11A-11D are detailed circuit diagrams of components 2100-2500, and FIG. 11E is a timing diagram illustrating their operation. Referring first to FIG. 11A, a detailed circuit diagram of AGC detector 2100 is therein illustrated. Basically, AGC detector 2100 is comprised of an operational amplifier 2120 having an input circuit 2121 and a feedback circuit 2123. Input circuit 2121 includes a diode 2122 having an input coupled to lead 801 for receiving signal S9. Diode 2122 operates to rectify signal S9, and feedback network 2123 operates to form the time average of the rectified signal. Amplifier 2120 has an output coupled to lead 2101; and signal AGC which represents the time average of the rectified S9 signal, is generated thereon. FIG. 11E illustrates an example of signals S9 and SGC.

A detailed circuit diagram of AGC scaling circuit 2200 is illustrated in FIG. 11B. The circuit is comprised of an operational amplifier 2220 having an input resistor 2221 and a feedback resistor 2222. Resistors 2221 and 222 provide a scaling factor of one fifth. Signal AGC is coupled through resistor 2221 to a negative input of amplifier 2220. Lead 2201 couples to the output of amplifier 2220.

FIG. 11C is a detailed circuit diagram of analog multiplexer 2300. Multiplexer 2300 is comprised of two, logically controlled switches, 2320 and 2321. Logic signals MUX1, MUX2, MUX3, and AUTOLEN, which are generated by a microprocessor 3500 on leads 3520, are utilized to logically control switches 2320 and 2321. FIG. 11C includes a truth table which lists the input signal that is passed by multiplexer 2300 as a function of the logical control signals. Each of the input signals therein listed is described in the following portions of this description. An output signal CMP1 of multiplexer 2300 is generated on lead 2301.

FIG. 11D is a detailed circuit diagram of comparator 2400 and digital-to-analog converter 2500. Comparator 2400 includes an operational amplifier 2420. Amplifier 2420 has an input coupled to receive signal CMP1 through a 10-K resistor 2421, and the same input is coupled to receive signal CMP2 through a 51-K resistor 2422. Amplifier 2420 has a second input coupled to ground, and has no feedback circuitry. Therefore, its output, which couples to lead 2401, switches between a high and low voltage level dependent upon whether or not signal CMP1 is greater or less than signal CMP2.

Digital-to-analog converter 2500 is comprised of an operational amplifier 2520 having a resistive feedback network 2521 and a resistive input network 2522. Therefore, amplifier 2520 acts as a summer. Signals DA0-DA3 are selectively coupled to the input of resistors 2522 via leads 2502 to thereby provide a digitally-controllable input to the summer. Microprocessor 3500 operates to set the logical states of DA0-DA3 in response to signals L1 and L2 received from control unit 40. These signals are initiated by manual operation of the control unit.

The operation of the above-described squelch apparatus is illustrated in FIG. 11E. During a first time interval, T1, signal S9 has a relatively low average amplitude. That is, signal SAGC is less than signal CMP2. As a result, signal CMP is at a low voltage level. Microprocessor 3500 samples signal CMP at intermittent intervals during the receive mode of operation, and disables volume control unit 1000 in response to signal CMP being at a low voltage level. During a second time interval, T2, the amplitude of signal S9 greatly increases indicating the presence of speed or other information therein. In response, signal SAGC increases to a level greater than the magnitude of signal CMP2, which results in signal CMP switching to a high voltage level. Microprocessor 3500 intermittently samples signal CMP, and in response to its high voltage level, enables volume control unit 1000 to permit the information present in a signal S9 to be converted into audible sounds.

The squelch circuitry is also used by the transceiver to perform a clear channel function and a busy channel function. Both functions are manually activated via control lead 40 as is described infra. Microprocessor 3500 receives signals via leads 3510 indicating the operations to be performed. In response thereto, processor 3500 stores the channel it is presently operating on in its memory. Then it sequentially steps through adjacent channels by varying frequencies $f_{s1}$ and $f_{s2}$. Processor 3500 monitors signal CMP for each channel stepped through and sends messages to processor 3600 indicating its state. When a clear channel or busy channel is found as the function requests, processor 3600 indicates that channel to the operator via display 3800. Then processor 3500 reselects the previously used channel.

The transceiver of FIG. 2 also includes means for performing an autolock function while receiving single sideband signals in the receive mode. The autolock function is implemented by means of autolock unit 2600. Unit 2600 has an input coupled to lead 901 for receiving signal S10 thereon, and has an output coupled via leads 2601 to an input of analog multiplexer 2300. Microprocessor 3500 receives the signals which are generated by the autolock unit on leads 2601 via multiplexer 2300 and comparator 2400. In response thereto, microprocessor 3500 calculates a value for the second selectable frequency $f_{s2}$ which will align signal S9 in the frequency domain with a fixed reference frequency. Microprocessor 3500 then generates micro-command signals on leads 3501 indicating values for N4–N6 which will generate the calculated frequency.

Figure 12A:
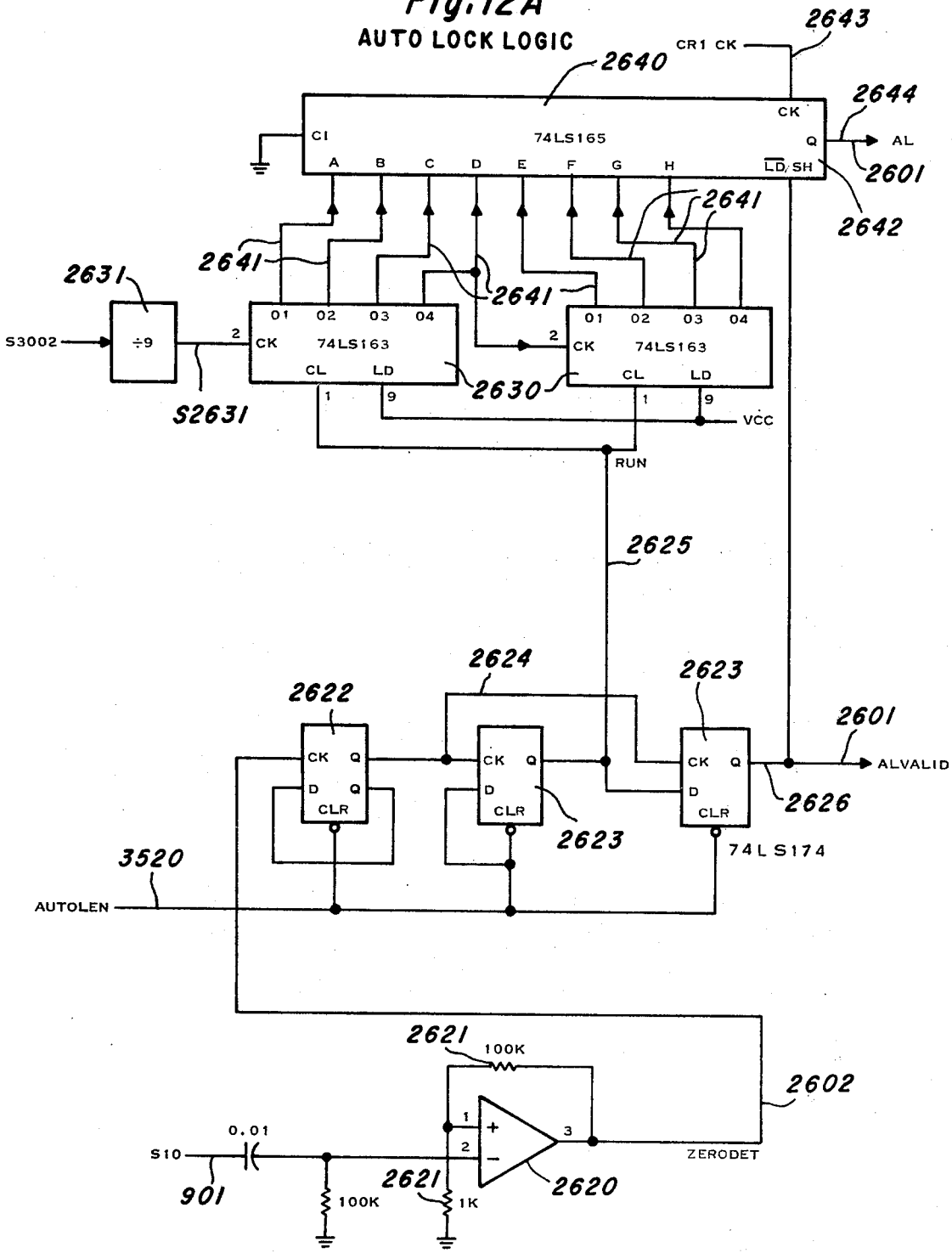
FIG. 12 is a detailed circuit diagram of the auto lock portion of the transceiver of FIG. 2.
Figure 12B:
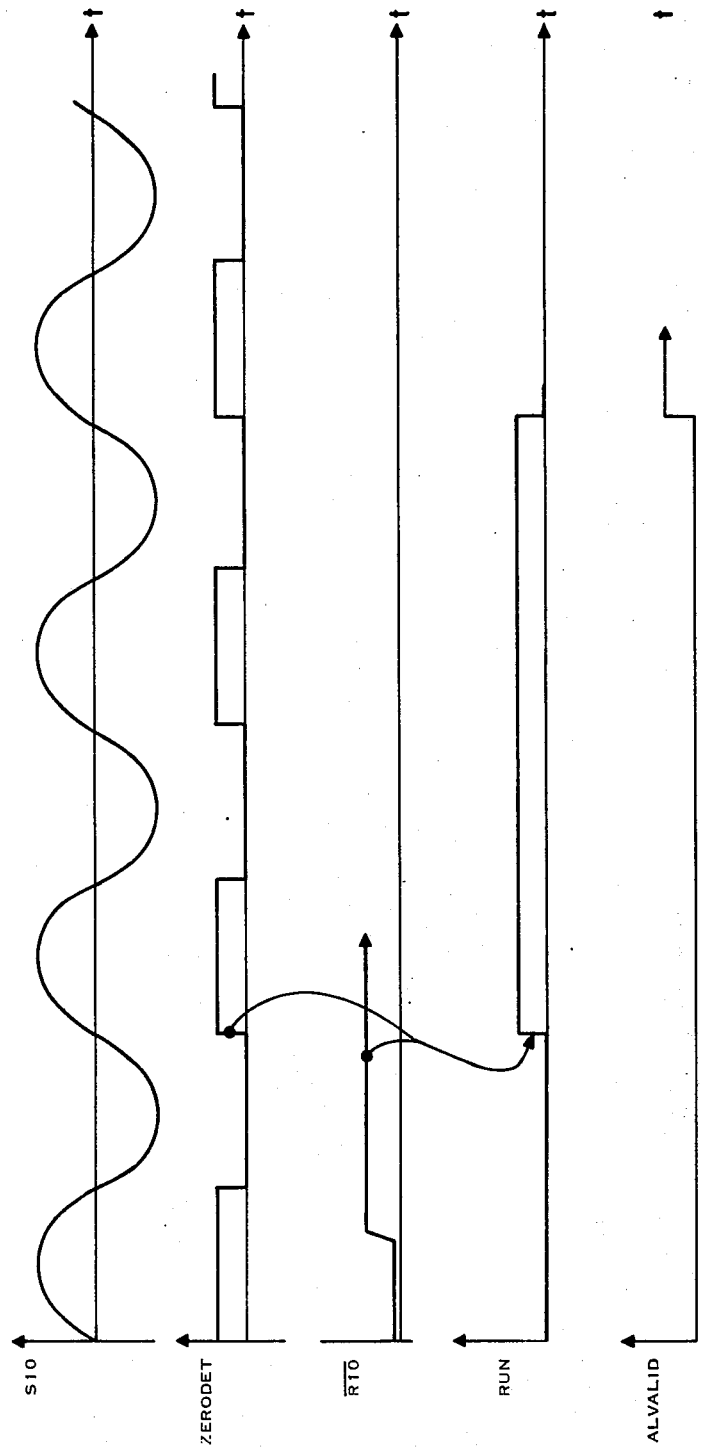

The detailed operation of the autolock function is best understood by referring to FIG. 12. FIG. 12A is a logic diagram of the autolock unit 2600, and FIG. 12B is a timing diagram of its operation. The single sideband signals on which autolock unit 2600 operates include an intermittently present carrier frequency. In one embodiment, this carrier is present for a short period of time just prior to the transmission of speech signals. Autolock unit 2600 operates to measure the actual frequency of the intermittently present carrier. Microprocessor 3500 receives signals on leads 2601 indicating the carrier frequency, and in response thereto, calculates an appropriate $f_{s2}$ frequency by comparing the actual frequency of the intermittently present carrier with an expected or nominal carrier frequency.

As illustrated in FIG. 12A, autolock unit 2600 includes an operational amplifier 2620 having an input coupled to lead 901 for receiving signal S10 thereon. A resistive feedback network 2621 is coupled to amplifier 2620 in a manner which makes amplifier 2620 operation as a zero detector. Amplifier 2620 has an output coupled to a lead 2602, and signal ZERODET is generated thereon. FIG. 11b includes the timing diagram on signals S10 and ZERODET. Lead 2602 couples to the clock input of a D-flip flop 2622. Flip flip 2622 has a Q output which couples via a lead 2624 to the clocking inputs of two other D-flip flops 2623. The signal AUTOLEN, which is generated by microprocessor 3500, enables flip flops 2622 and 2623 when it is true.

Flip flops 2623 are intercoupled to generate signals RUN and ALVALID on leads 2625 and 2626, respectively only when signal AUTOLEN is true. Signal RUN is coupled via a lead 2625 to two, four-bit counters 2630. Counters 2630 are enabled to count whenever signal RUN is true, and are cleared when signal RUN is false. Counters 2630 may be implemented by a 74LS163 as an example. A clock input of counter 2630 is coupled to receive a signal S2631 having a fixed frequency of approximately 100 KHz. Signal S2631 is generated by a divide by 9 counter 2631, having a clocking input coupled to receive signal S3002.

Autolock unit 2600 also includes an 8 bit shift register 2640 having parallel inputs coupled via leads 2641 to outputs of counter 2630. A control unit 2642 of register 2640 is coupled to receive logic signal ALVALID via lead 2626. Data is transferred from counters 2630 via leads 2641 into register 2640 when signal ALVALID makes a low voltage to high voltage transition. This transition occurs after counters 2630 have been enabled for two cycles of signal ZERODET.

As is illustrated in FIG. 11C, signal ALVALID also couples to analog multiplexer 2300 where it is sensed by microprocessor 3500. Further, register 2640 has a clocking input which is coupled to receive logic signal CRICK via lead 2643, and has a data output which is coupled to multiplexer 2300 via lead 2644. Thus, microprocessor 3500 is capable of reading register 2640 under program control.

In one embodiment, the intermittently transmitted carrier has a frequency of 1600 Hz. By comparison, counters 2630 are clocked at a frequency of approximately 100 kHz. Since the difference in the two frequencies is large, the contents of register 2640 will reflect the actual frequency present in signal S9 to a high degree of accuracy.

Figure 13:
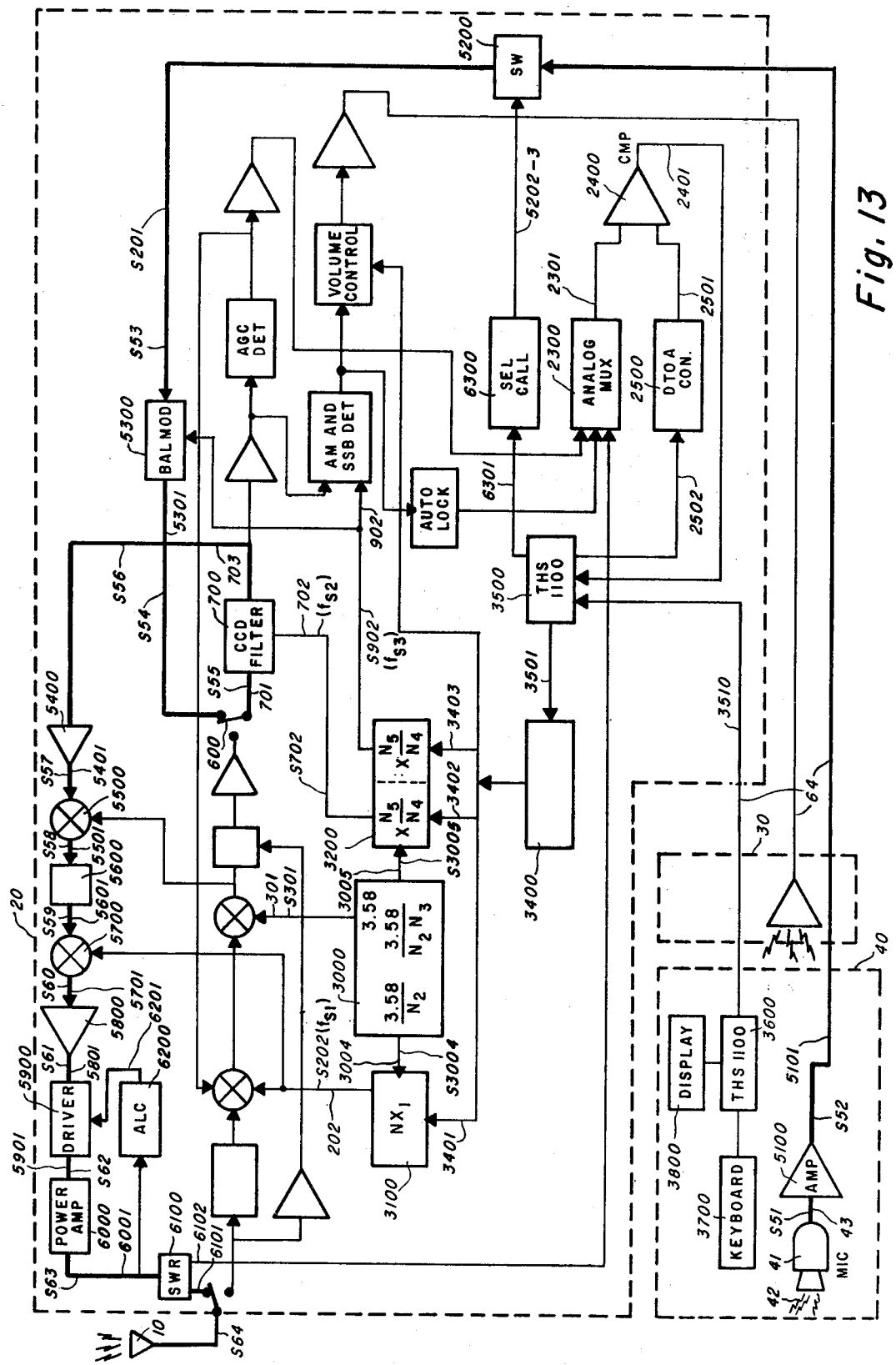
FIG. 13 is a circuit diagram identical to FIG. 2 with the exception that the transmit signal path components are emphasized rather than the receive signal path components.
Figure 14:
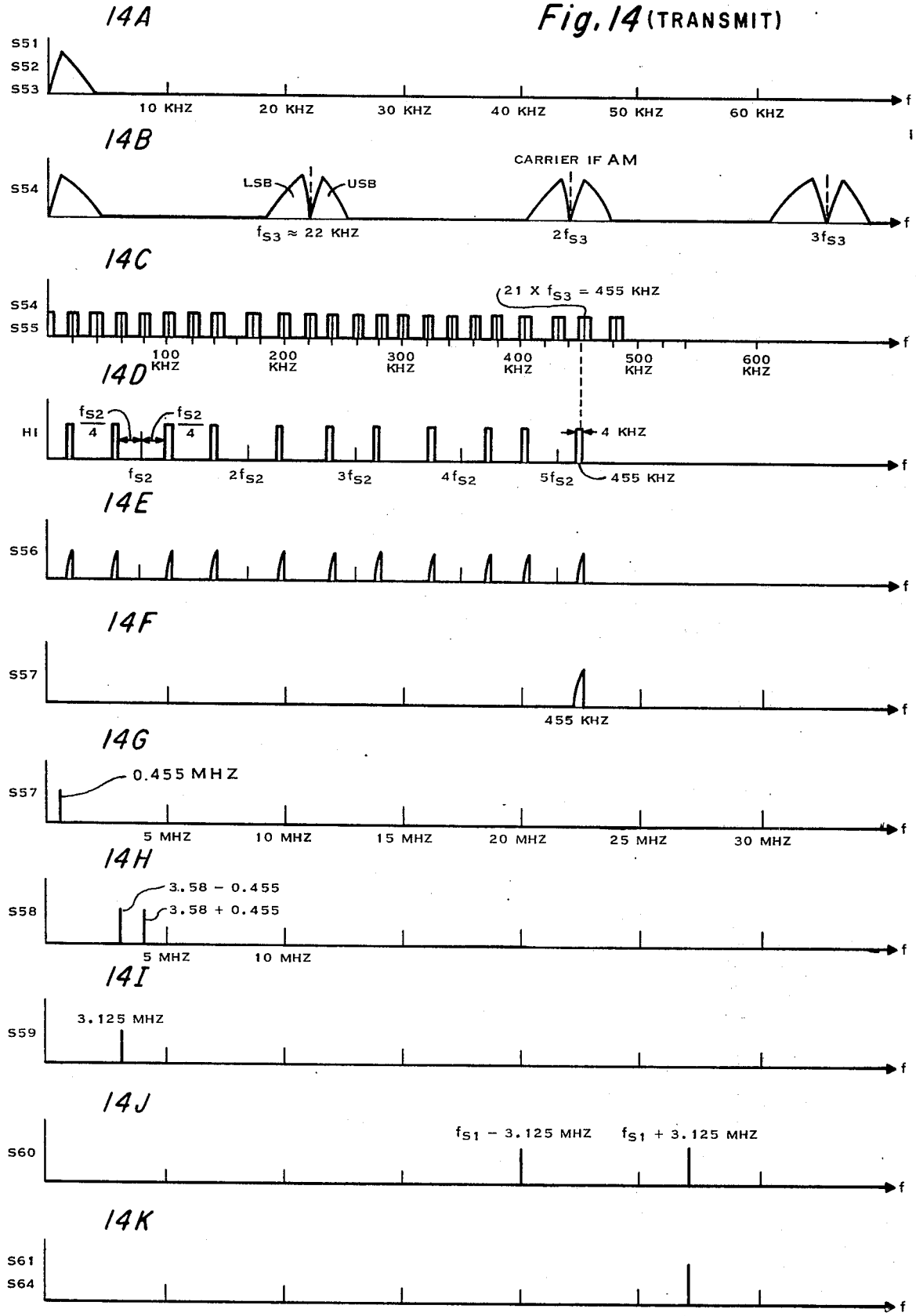
FIG. 14 is a series of frequency diagrams 14A–14K illustrating signals at various points on the transmit signal path of FIG. 13.

The operation of the transceiver of FIG. 1, while it is in the transmit mode, will now be described in conjunction with FIGS. 13 and 14. FIG. 13 is identical to the previously described FIG. 2, except that FIG. 13 contains reference numerals identifying those components of the transceiver which are utilized in a transmit mode, whereas FIG. 2 contains reference numerals identifying those components used in the receive mode. Also, in FIG. 13, the transmit signal path is emphasized by a thickened line, whereas in FIG. 2, the receive signal path is emphasized by a thickened line. Signals S51–S64 are generated at various points on the transmit signal path as indicated in FIG. 14.

Microphone 41 is the first component included within the transmit signal path. Microphone 41 receives sound waves 42, and in response thereto, generates electronic signals S51 on a lead 43. Lead 43 couples to the input of an audio amplifier 5100. Amplifier 5100 has an output coupled via a lead 5101 to a switch 5200, and signals S52 are generated thereon by amplifier 5100.

When speech is being transmitted, switch 5200 passes signals S52 to its output. Signals S53 at the output of switch 5200 are coupled via lead 5201 to the signal input of a balanced modulator 5300. Modulator 5300 also has a clocking input which is coupled to lead 902 for receiving signals S902 (which contain the third selectable frequency $f_{s3}$). Modulator 5300 has an output coupled via a lead 5301 to switch 600, and signals S54 are generated thereon. Signals S54 are double sideband signals in the sideband mode of operation, and are amplitude modulated signals in the AM mode of operation. That is, the carrier frequency, which equals multiples of the third selectable frequency $f_{s3}$, is inserted into signal S54 only in the AM mode of operation by modulator 5300.

Modulator 5300 generates signals S54 by sampling signals S53 at a frequency $f_{s3}$ of approximately 22 kHz. Diagram 14B and 14c illustrate the effect of this sampling operation on two different frequency scales. As therein illustrated, signal S54 is comprised of a plurality of identical frequency spectrums, each of which is centered about a multiple of frequency $f_{s3}$. The center of the 21st frequency spectrum lies at 455 kHz. Thus, the lower sideband portion of the 21st spectrum is centered at approximately 450 kHz, and the upper sideband portion of the 21st spectrum is centered at approximately 460 kHz.

In the transmit mode, filter 700 is coupled to receive signal S54 through switch 600. The function of filter 700 is to selectively filter either the lower sideband, the upper sideband, or the AM signal which lies nearest to 455 kHz. Thus, dependent upon the mode of operation, the clocking frequency $f_{s2}$ of filter 700 is selectively chosen. Diagram 14D illustrates the passbands of filter 700 when it is clocked to pass only the lower sideband. As was the case for the previously-described read mode of operation, the 11th passband of filter 700 is used to filter sidebands from an input signal; whereas, the fifth passband of filter 700 is used to filter an AM band from an input signal.

The output of filter 700 generates signals S56. Signals 56 are coupled via a lead 703 to a tuned amplifier 5400. Amplifier 5400 is tuned to 455 kHz. Amplifier 5400 has an output lead 5401 and signals S57 are generated thereon. Diagrams 14E and 14F illustrate signals S56 and S57 in the frequency domain. As therein illustrated, signal S56 includes a plurality of filtered frequency bands; whereas, signal S57 includes only that band which is nearest to 455 kHz.

Lead 5401 couples to the input of a mixer 5500. Mixer 5500 has a clocking input which is coupled to a lead 301 for receiving signals S301 thereon. Signal S301 includes a fixed 3.58-mHz frequency, and it is generated as described supra. Mixer 5500 has an output coupled to a lead 5501, and signals S58 are generated thereon. Signals S58 signals S57 frequency shifted to 3.58 mHz±455 kHz.

Lead 5501 couples to the input of the filter 5600. Filter 5600 is tuned to only pass frequencies near 3.125 mHz. The output of filter 5600 is coupled to a lead 5601, and signals S59 are generated thereon. Diagram 141 illustrates signals S59 in the frequency domain.

Lead 5601 couples to the input of a mixer 5700. Mixer 5700 has a clocking input which couples to lead 202 for receiving, signals S202. Signals S202 are generated as previously described, and contain the first selectable frequency $f_{s1}$. Frequency $f_{s1}$ is selectively chosen such that the sum of $f_{s1}+3.125$ mHz equals the center frequency of the channel on which signals S51 are to be broadcast. Mixer 5700 has an output coupled to a lead 5701, and signals S60 are generated thereon. Signals S60 equal signals S59 frequency shifted to $f_{s1}\pm3.125$ mHz as indicated in Diagram 14J.

An amplifier 5800 is coupled to receive signal S60, and to tune out the lower band of frequencies. Diagram 14K illustrates the frequency spectrum of signal S61.

Signal S61 is serially coupled to the antenna 10 through a driver circuit 5900, a power amplifier 6000, and a standing wave ratio measuring circuit 6100. Signals S62, S63, and S64 are generated by these circuits, respectively. Driver 5900 and power amplifier 6000 modify the amplitude of signal S61, but not the frequencies contained therein. Thus, signal S64, which is transmitted by antenna 10, has the same frequency spectrum as signals S61, as illustrated in Diagram 14K.

The transceiver of FIG. 13 further includes means for performing a selective call operation. To perform a selective call operation, a receiving transceiver is assigned a call number. The call number consists of a sequence of five digits. Subsequently, a transmitting transceiver transmits the call number; and in response thereto, the receiving transceiver senses the transmitted call number as being the one which it was assigned. In response to the sensing of its call number, the receiving transceiver performs a preprogrammed operation (e.g., the microprocessor in the receiving transceiver turns the volume on).

Figure 15:
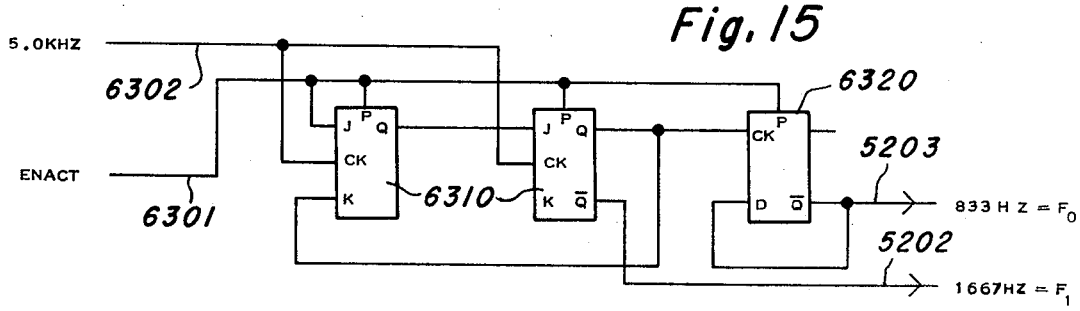
FIG. 15 is a logic diagram of the selective call unit included within the transceiver of FIG. 13.

FIG. 15 is a logic diagram of a selective call unit 6300 which is included in the transceiver of FIG. 13. Call unit 6300 is comprised of two J-K flip-flops 6310 and a D flip-flop 6320. The J-K flip-flops are intercoupled to form a divide-by-three counter, while the D flip-flop is intercoupled to form a divide-by-two counter. A logic signal ENACT generated by a microprocessor 3500 is coupled via a lead 6301 to enable counters 6310 and 6320; and a clocking signal having a fixed frequency of 5.0 kHz is coupled via a lead 6302 to clocking inputs of flip-flops 6310. In response thereto, a signal f1 of 1667 Hz and a signal f0 of 833 Hz are generated on leads 5202 and 5203 respectively. Leads 5202 and 5203 couple to the input of switch 5200 as was previously described in conjunction with FIG. 15B. The output of switch 5200 is logically controlled by a microprocessor 3500 via logic signals A6 and R2.

The above-described configuration provides a means for transmitting a binary coded selective call number. Each digit of the selective call number is represented by a sequence of four binary bits. A "0" bit is represented by 833 Hz, while a "1" is represented by 1667 Hz. The "1" and "0" frequency assignments may also be reversed as an alternative. Each bit comprising the call number is transmitted for one bit period. The bit period equals 32 ms in one embodiment. The actual transmission of a call number is manually activated via control unit 40, as is described infra.

The receiving transceiver utilizes the previously-described autolock logic 2600 for recognizing when its assigned unit number is transmitted. The receiving transceiver first monitors the SAGC signal to determine the presence of signal. Then it enables its autologic. Once enabled, the AL signal reflects a count of either 833 Hz or 1667 Hz for each bit that is transmitted. Microprocessor 3500, in the receiving transceiver, reads signal AL and compares the bit sequence to its assigned unit number. When the received call number and the assigned call number are equal, the receiving transceiver is activated.

Selective call unit 6300 is also utilized in the sideband transmit mode to transmit an intermittent carrier for the receiving transceiver to lock onto. (The operation of the receiving transceiver was described in conjunction with FIGS. 12A and 12B). In one embodiment, microprocessor 3500, in the transmitting transceiver, logically controls switch 5200 such that selective call unit 6300 transmits the 1667-Hz frequency for 300 ms at the beginning of each transmission. The receiving transceiver detects the presence of the transmitted frequency by monitoring SAGC, and by enabling autolock unit 2600 when SAGC exceeds the squelch level.

All of the previously described details may be interrelated by considering typical transceiver operations in conjunction with the transceiver block diagrams of FIGS. 2 and 13. Referring to FIG. 2, for example, suppose an operator wishes to operate on channel 1 in the lower sideband mode. Utilizing keyboard 3,700, the operator sequentially depresses digit keys 0 and 1, and control key LB. In response thereto, processor 3,600 senses the depressed keys, and sends messages via leads 3,510 to the slave processor 3,500.

Slave processor 3,500 interprets the messages and in response thereto sends microcommands to registers 3,400 via leads 3,501. The microcommands indicate clocking frequencies $f_{s1}$, $f_{s2}$, $f_{s3}$, such that the lower sideband of channel 1 will pass through the received signal path. The previously described Table IV indicates the details of these microcommands. In particular, the microcommands will indicate an $N_1$ of 9,536; and $N_4$ of 55; an $N_5$ of 19,125; and an $N_6$ of 235. Recall that the values of $N_2$ and $N_3$ are fixed at 1,432 and 10, respectively. As a result of these microcommands, clocking module 3,100 generates clocking signal S202 of a frequency 23.84 MHZ. Similarly, clocking module 3,200 generates clocking signal S702 with frequency 86,932 and also generates clocking signal S902 with a frequency of 20,345 HZ.

Mixer 200 mixes signals S2 and frequency $f_{S1}$ to thereby generate signals S3 on lead 201. Frequency $f_{S1}$ was chosen such that channel 1 of signal S3 is centered at frequency 3.125 MHZ because mixer 200 includes a tank circuit having a resonant frequency of 3.125 MHZ. As such, signal S3 discriminates between the selected channel and the surrounding channels.

Mixer 300 mixes signal S3 with the fixed frequency of 3.58 MHZ. The difference between 3.58 MHZ and 3.125 MHZ equals 455 KHZ; and mixer 300 includes a tank circuit having a center frequency of 455 KHZ. Thus, the output of mixer 300, which is signal S4, contains channel 1 at 455 KHZ.

Signal S4 is coupled to CCD filter 700 through a switch 600. Switch 600 is controlled by microcommands for processor 3,500. The microcommands are generated in response to the manually activated PTT key on keyboard 3,700.

Filter 700 receives signals S5 and filters the lower sideband from the signal in response to frequency $f_{S2}$ of clocking signals S702. Signal S8, which is the output of the filter, is the lower sideband of channel 1 as the operator selected.

Signal S8 passes through the modulator 900. The modulator 900 simultaneously receives clocking signals on leads 902 which contain the third selectable frequency $f_{S3}$. Demodulator 900 samples the selected sideband signals at frequency $f_{S3}$; and as a result, the selected sideband is frequency shifted to the audio range.

The demodulator output is coupled via lead 901 to volume control unit 1,000, which amplifies its input signals in response to microcommands. These microcommands are entered into register 3,400 by processor 3,500 in response to messages from processor 3,600 indicating that the operator depressed the V↑ or V↓ key. Audio amplifier 1,100 amplifies the output of the volume control unit, and the output of the amplifier is coupled to speaker 1,200.

When the operator wishes to transmit on his selected channel, he simply pushes the PTT key on keyboard 3,700. As a result, processor 3,600 sends a message to the slave processor 3,500 via leads 3,510. In response thereto, processor 3,500 generates microcommands which couple the input to filter 700 to the transmit path, and which couple the antenna to the transmit path.

Additionally, processor 3,500 generates microcommands which couple selective call unit 6,300 to the transmit path lead 5,201 via switch 5,200. These microcommands are generated in a sequence such that a frequency of 1,667 Hz is first transmitted for a period of several milliseconds. During this time interval, microprocessor 3,500 monitors the magnitude of the forward travelling waves and the reverse travelling waves on antenna 10. This is accomplished by selecting the SWR output by microcommand via analog multiplexer 2,300, and by monitoring the magnitude of the selected signals via leads 2,401.

Note also that during this time period, the receiving transceiver will have its squelch broken, and thus will enable its autolock logic 2,600 via microcommand from processor 3,500. The receiving transceiver monitors the actual frequency transmitted by enabling autolock unit 2,600, by sending microcommands to multiplexer 2300 which select the autolock unit, and by reading signals on leads 2,401. The receiving transceiver then compares the actual frequency of the carrier with the nominal frequency, and makes adjustments to frequency $f_{S2}$ which compensate for any differences. In one embodiment, the receiving unit makes the adjustments by modifying multiplier N5 in clocking module 3,200.

Subsequently, the transmitting unit utilizes the selective call circuitry 6,300 to perform an autocall function (if the operator has so specified via keyboard 3,700). To this end, processor 3,500 generates microcommands which sequentially couple the 1 frequency and the 0 frequency of the selective call unit 6,300 to the transmit path via switch 5,200. Each bit comprising the selective call number is broadcast for only several milliseconds, and thus the entire operation is completed in a fraction of a second. Thus, the SWR monitoring function, the autolock function, and the selective call function are all easily performed between the time that the operator depresses a pushed PTT key and the time in which he begins to speak. After the last bit of the selective call message is transmitted, processor 3,500 generates the microcommand to switch 5,200 which couples signals S52 through the switch thereby enabling speech transmissions. Alternatively, if the operator has specified a digital control message for transmission, then processor 3500 will broadcast the bits of that message following transmission of the selective call number.

Various embodiment of the invention have now been described in detail. Since it is obvious that many changes and modifications can be made in the above details without departing from the nature and spirit of the invention, it is understood that the invention is not to be limited to said details except as set forth in the appended claims.

What is claimed is:

1. An automatically clarifying radio receiver comprising:
   (a) digital processor means for controlling the radio receiver;
   (b) receiver circuit means for receiving and processing radio frequency signals including intermittently received reference frequency signals of a predetermined frequency, said digital processor means including means for generating digital signals representative of the expected frequency of said reference frequency signal;
   (c) an oscillator;
   (d) programmable counter means coupled to said oscillator and to said digital processor means, said counter means for generating output signals of frequencies selected by said digital processor means, said receiver circuit means being operated by said output signals from said programmable counter means;
   (e) comparator means coupled to said receiver circuit means and to said digital processor means for comparing the actual frequency of received reference frequency signals with the digital signal representative of the expected frequency of said reference frequency signal generated by said digital processor means, said digital processor means being responsive to said comparator means for computing the frequency difference between the actual frequency of said received reference frequency signals and said expected frequency and for controlling said programmable counter means to generate said output signals according to said computed frequency difference thereby adjusting the signal processing of said receiver circuit means to clarify the reception of said radio receiver.

2. The radio receiver according to claim 1 wherein said comparator means is comprised of a digital-to-analog converter for converting said digital signal representative of the expected frequency into an analog signal and analog comparator means for comparing said received reference frequency signal to said analog signal.

3. The radio receiver according to claim 2 wherein said analog comparator means generates a predetermined logic signal to said digital processor means only when the frequency of said received reference frequency signal is equal to the frequency of the digital signal generated by said digital processor means and wherein said digital processor means incrementally adjusts the frequency of said digital signal from said expected frequency until the frequency of said generated signal is equivalent to the frequency of said received signal as indicated by said predetermined logic signal being generated by said comparator means.

4. The radio receiver according to claim 1 wherein said receiver circuit means includes a detector circuit coupled to said programmable counter means for sampling and thereby demodulating said received radio frequency signals at a rate according to the frequency of an output signal generated by said programmable counter means, the sampling rate of said detector circuit being adjustable according to the computed frequency difference.

5. The radio receiver according to claim 1 wherein said receiver circuit means includes a clocked filter coupled to said programmable counter means for filtering a selected pass band of said received radio frequency signals according to the frequency of an output signal provided by said counter means to said clocked filter, the selected pass band being adjustable according to the computed frequency difference.

6. The radio receiver according to claim 5 wherein the center frequency of said clocked filter is adjustable according to the computed frequency difference.

7. The radio receiver according to claim 5 wherein the pass band width of said clocked filter is adjustable according to the computed frequency difference.

8. The radio receiver according to claim 5 wherein said clocked filter is a charge coupled device transversal filter having a finely tuneable center frequency and pass band width adjustable in accordance with a clocking signal applied thereto and wherein said center frequency and pass band width are adjusted by means of said programmable counter means and digital processor means according to the computed frequency difference.

* * * * *